United States Patent [19]

Voles

[11] Patent Number: 4,996,428
[45] Date of Patent: Feb. 26, 1991

[54] THERMAL IMAGING DEVICE
[75] Inventor: Roger Voles, London, England
[73] Assignee: Thorn Emi Electronics Limited, Hayes, England
[21] Appl. No.: 359,881
[22] Filed: Jun. 1, 1989
[30] Foreign Application Priority Data
Jun. 1, 1988 [GB] United Kingdom ............... 8812957
[51] Int. Cl.$^5$ ............................ G01J 5/06; G01J 5/02
[52] U.S. Cl. ................................ 250/332; 250/338.3; 250/333
[58] Field of Search ...................... 250/332, 333, 338.3
[56] References Cited
U.S. PATENT DOCUMENTS

| | | | |
|---|---|---|---|
| 4,593,456 | 6/1986 | Cheung | 250/332 X |
| 4,663,529 | 5/1987 | Jenner et al. | 250/332 X |
| 4,701,618 | 10/1987 | Tosswill | 250/332 X |
| 4,737,642 | 4/1988 | Steil et al. | 250/332 |
| 4,754,139 | 6/1988 | Ennulat et al. | 250/332 |

FOREIGN PATENT DOCUMENTS 2163596 2/1986 United Kingdom .

Primary Examiner—Constantine Hannaher
Assistant Examiner—Jacob M. Eisenberg
Attorney, Agent, or Firm—Fleit, Jacobson, Cohn, Price, Holman & Stern

[57] ABSTRACT

A pyroelectric film has a pattern of interconnected electrodes formed on one major surface, and a pattern of discrete electrodes and electrically conductive patches formed on the other major surface. The film 21 is supported by pillars connected to the patches, the pillars also producing a path for electrical signals between the patches and a signal processing means. Each discrete electrode is connected to a respective patch by a respective strip of electrically conductive material.

9 Claims, 5 Drawing Sheets

SECTION AT A-A

THERMAL IMAGING DEVICE

BACKGROUND OF THE INVENTION

This invention relates to thermal imaging devices and in particular to thermal imaging devices comprising an array of pyroelectric detector elements responsive to infrared radiation.

The main factor limiting the performance of existing pyroelectric imaging devices in detecting an image of a scene focussed on the array of pyroelectric detector elements is the thermal conductance between adjacent detector elements and between each detector element and the supporting and interrogating structure.

U.K. Patent Application No. 2163596A discloses a thermal imaging device comprising a ferroelectric slab bearing a common electrode on one main surface and a signal electrode structure on the opposite main surface. The signal electrode structure is electrically connected to electrodes of a circuit substrate by means of conductors The transverse heat conduction between adjacent conductors is reduced by incorporating conductors each in a respective pillar of thermally insulating material, the pillars also being effective to support the ferroelectric slab.

SUMMARY OF THE INVENTION

It is an object of the present invention to provide an alternative thermal imaging device in which the pyroelectric detector elements are supported by pillars but wherein the thermal losses between the detector elements and supporting pillars are reduced.

According to the present invention a thermal imaging device comprises: a layer comprising pyroelectric material; an array of interconnected electrodes carried on one major surface of the layer; an array of discrete electrodes carried on the other major surface of the layer; a plurality of pillars effective to support the layer and to cause the passage of electrical signals between the discrete electrodes and an electrical signal processing means, each pillar being located at a respective electrically conductive region formed on said other major surface, each discrete electrode being separated from, but not substantially surrounding, a respective one of the first electrically conductive regions, each discrete electrode and respective electrically conductive region being electrically connected by a respective elongate strip of electrically conductive material.

The pyroelectric material may comprise material which is inherently pyroelectric, or material whose pyroelectric characteristics are induced (e.g. by appropriate poling of ferroelectric material).

The layer is suitably a thin film of pyroelectric material.

The elongate strip suitably has a length to width ratio of at least 5.

In one embodiment the discrete electrodes are arranged in rows and columns and said electrically conductive regions are situated at the centres of respective rectangles formed by the centres of four adjacent discrete electrodes.

In another embodiment the discrete electrodes are arranged in interleaved rows and interleaved columns and the electrically conductive regions are situated at the centres of respective triangles formed by the centres of three adjacent, discrete electrodes.

In another embodiment, respective supplementary electrodes are provided in the non-electroded regions of the other major surface between each discrete electrode and the adjacent pillars, each supplementary electrode being connected to a respective pillar, the pillar having two independent electrically conductive paths to the signal processing means.

By processing signals originating from the supplementary electrodes, an improved signal/noise ratio may be achieved.

In another embodiment, received infrared radiation incident on the nonelectroded regions of the layer is diverted into the electroded regions by an optical arrangement.

The use of a thin pyroelectric film, with pillars remote from the relevant discrete electrodes and long, narrow conductors to connect the discrete electrodes to the appropriate pillars via the patches ensures that the thermal conductance from each pixel to the relevant support pillar is small.

Six thermal imaging devices in accordance with the invention will now be described, by way of example only, with reference to the accompanying drawings of which:

DESCRIPTION OF THE PREFERRED EMBODIMENTS

Figure 1A:
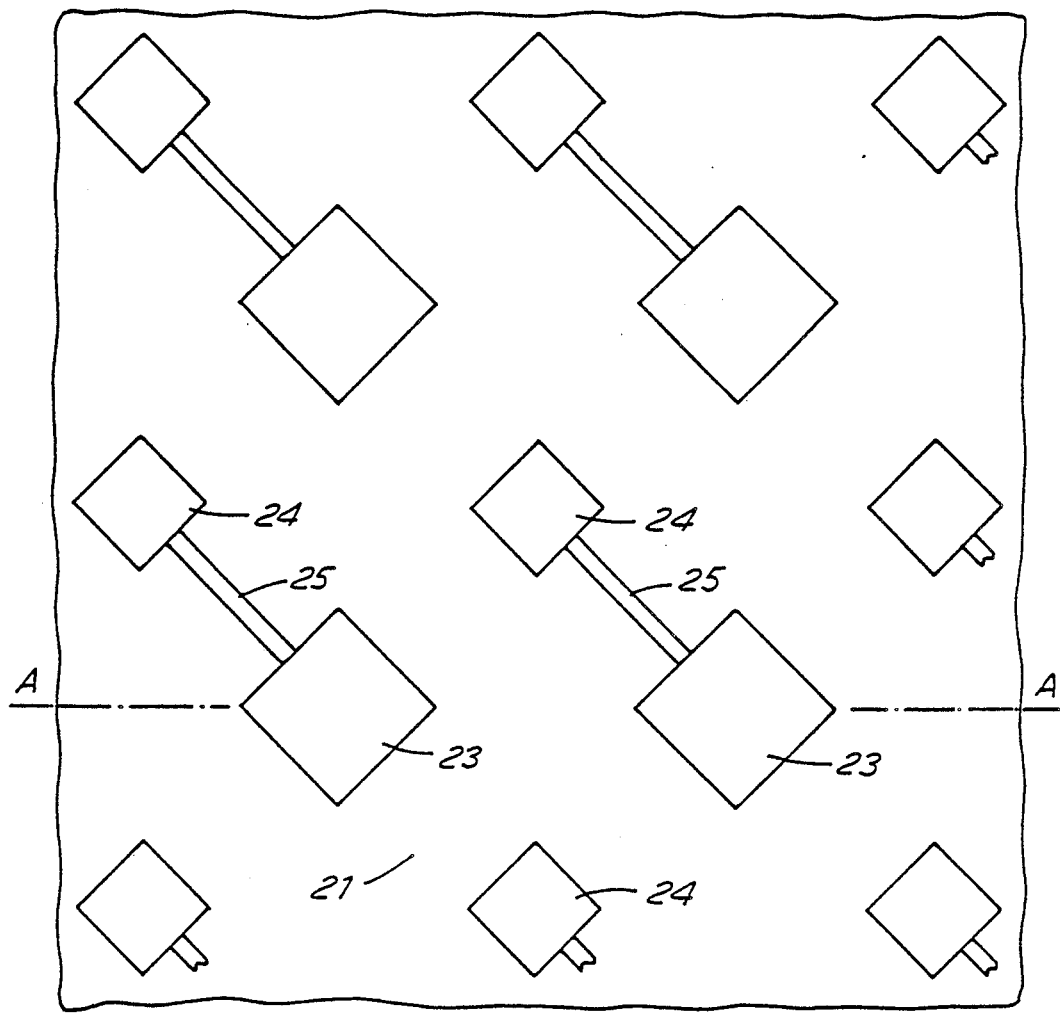
FIG. 1(a) is a schematic sectional view of a part of the first device showing the discrete electrode structure.
Figure 1B:
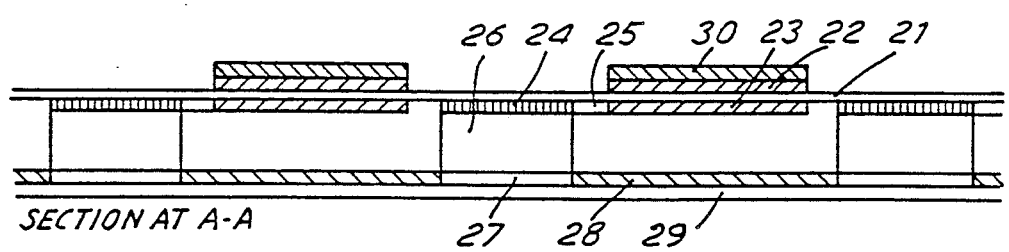
FIG. 1(b) shows a section at AA in FIG. 1(a).

In the embodiment shown in FIG. 1, a pyroelectric film 21, of for example, polyvinylidene fluoride (PVDF) has a pattern of interconnected electrodes 22 formed on one side and a pattern of discrete electrodes 23 and electrically conductive patches 24 formed on the other side. The discrete electrodes 23 are linked to respective patches 24 by narrow electrically conductive strips 25. Electrically conductive pillars 26 are bonded at one end to respective patches 24 and at the other end to input pads 27 of an integrated circuit 28 formed on the substrate 29. As shown in FIG. 1(a), the discrete electrodes 23 are arranged in rows and columns and the patches 24 are arranged in rows and columns which interleave those of the discrete electrodes 23. In the example of FIG. 1, the electrodes 22 and 23 are each of equal size and the patches 24 and pillars 26 are also of equal size, but smaller than the electrodes. Also in this example the electrodes, patches and pillars are all square and arranged so that each of the inter-connected patches and electrodes has one face perpendicular to the conductive strip joining the patch and electrode. The inter-connected electrodes 22 are covered by an infrared absorbent layer 30, for example a layer of black gold. The inter-connections between these electrodes 22 should be narrow, thin and preferably meandered to increase their length. The interconnected electrodes are connected to ground.

Figure 2:
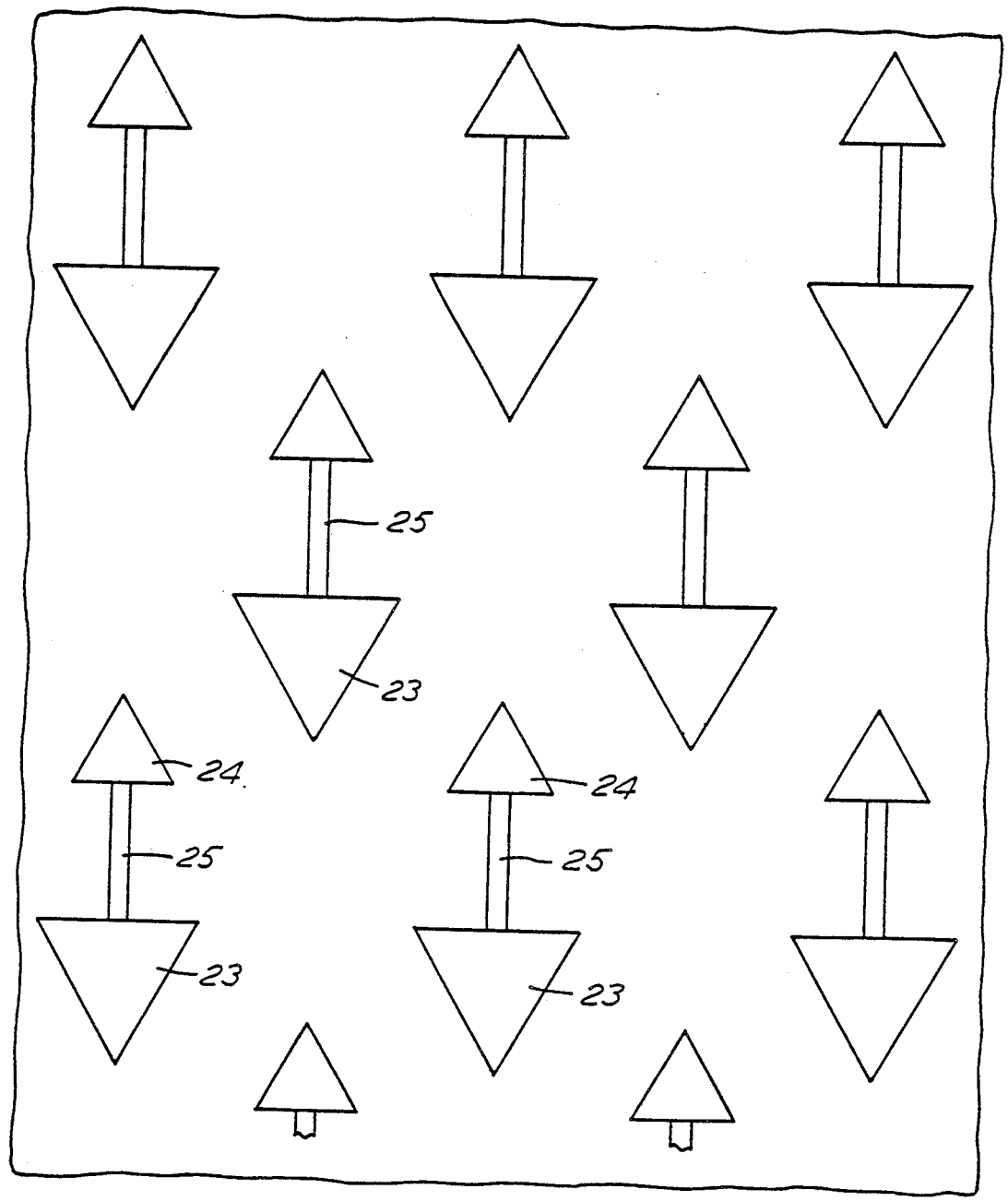
FIG. 2 is a schematic sectional view of a part of the second device showing the discrete electrode structure.

Referring now to FIG. 2, in which as in all the drawings corresponding features to those shown in FIG. 1 are correspondingly labelled, the discrete electrodes 23 are arranged in interleaved rows and columns and the patches 24 are arranged at the centres of the triangles formed by three adjacent electrodes 23, each patch being connected to a respective electrode by a narrow conductor 25. Apart from the changed positions of the electrodes, patches and pillars the construction of this embodiment is similar to that described hereinbefore with reference to FIG. 1.

Figure 3:
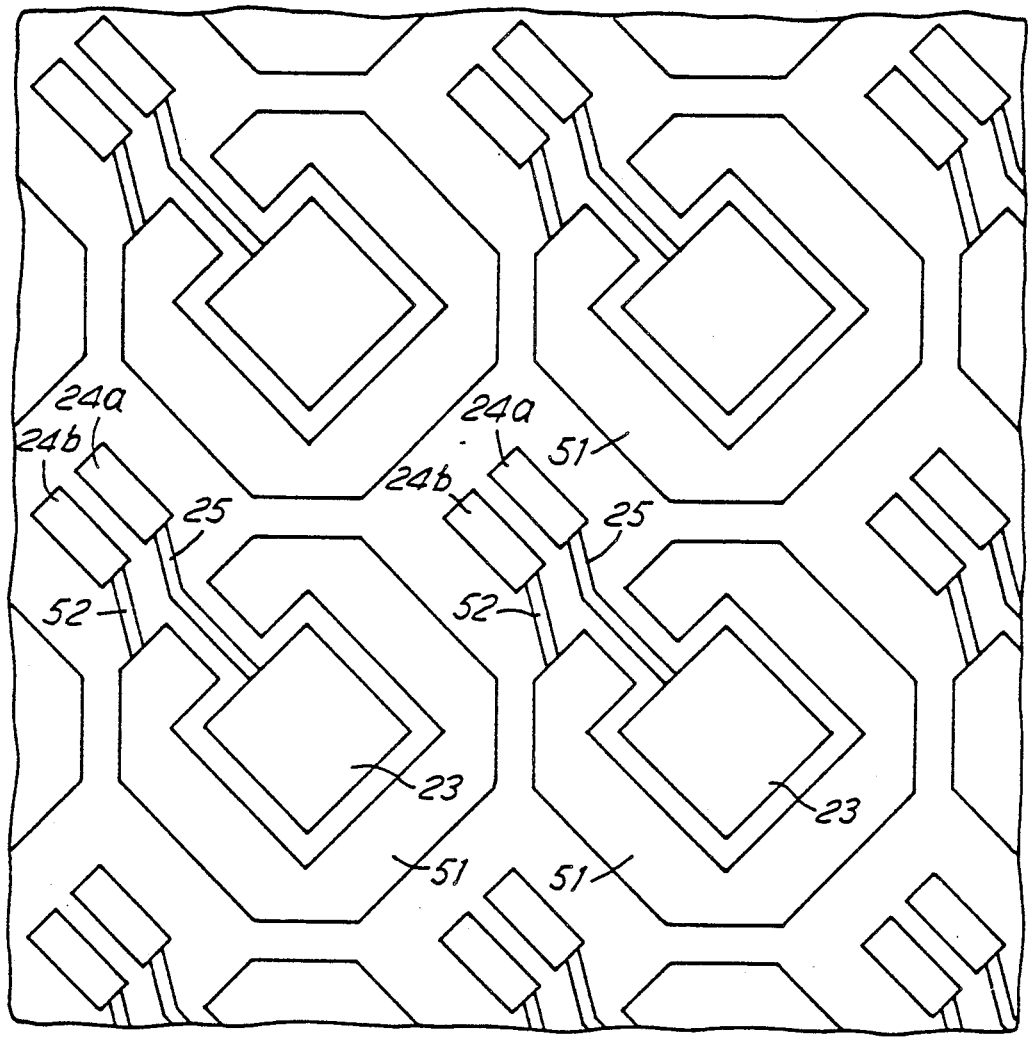
FIG. 3 is a schematic sectional view of a part of the third device showing the discrete electrode structure.

The devices illustrated in FIGS. 1 and 2 suffer the disadvantage that each discrete electrode 23 has an area around it in which the received radiation is wasted. This is overcome in the third device to be described by the provision of a supplementary electrode around the electrode 23, as shown at 51 in FIG. 3. In FIG. 3, the arrangement of electrodes 23 is the same as in FIG. 1, but the conducting patches 24 are each split into two patches 24a, 24b. Each electrode 23 is connected to a corresponding patch 24a by the narrow conductor 25 and each of the extra electrodes 51 is connected to the corresponding patch 24b by the narrow conductor 52. The two patches 24a, 24b are connected to a respective one of a respective pair of input pads of an integrated circuit either by a pair of electrically conductive pillars (not shown) or by an insulative pillar (also not shown) carrying two electrically conductive tracks.

Both inputs to the processing means are pre-amplified, weighted and added. The supplementary electrode has higher thermal losses than the discrete electrode, so the supplementary electrode output is given a lower weighting than the discrete electrode output, but is still able to improve the signal/noise ratio.

Figure 4A:
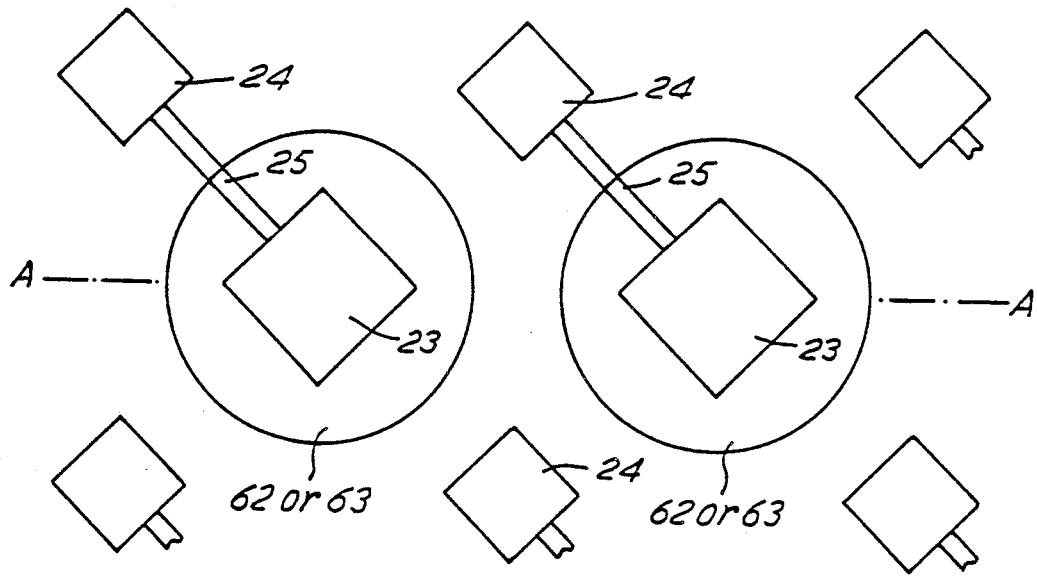
FIG. 4(a) is a schematic sectional view of part of the fourth device showing the discrete electrode structure.
Figure 4B:
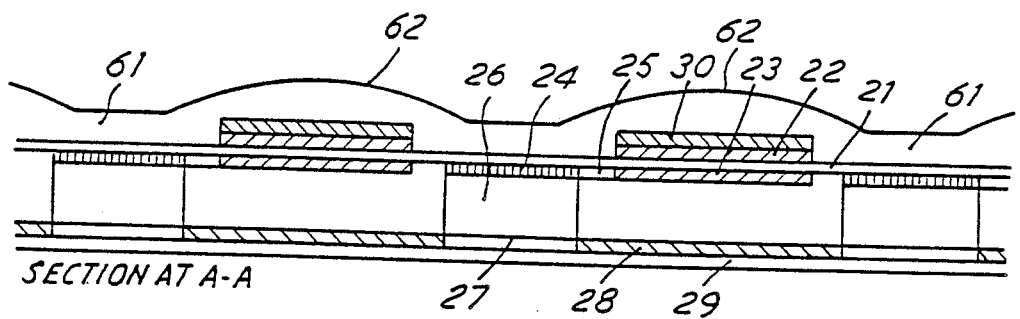
FIG. 4(b) shows a section along A—A in FIG. 4(a)
Figure 4C:
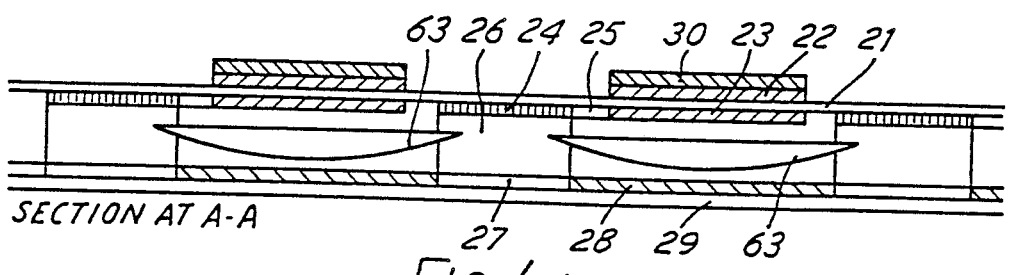
FIG. 4(c) shows a sectional view of a modification of the device shown in FIG. 4(b).

The fourth and fifth devices to be described both incorporate optical means for using some of the otherwise wasted received radiation. Referring to FIGS. 4(a) and 4(b) in the fourth device, a plate 61 transparent to infrared covers the array of inter-connected electrodes 30 and is profiled to provide convex surfaces 62 over each electrode area so that received radiation is concentrated towards the electrode area. In the fifth device, which is shown in FIG. 4(c), the plate 61 is replaced by concave reflecting surfaces 63 positioned behind each discrete electrode 23, the plate reflecting the energy received around the electrodes back towards the electrodes. In some circumstances it may be advantageous to cover the discrete conductors 23 with an infrared absorbent layer, for example a layer of black gold, to absorb the energy reflected back by the concave surface 63. In the plan view of FIG. 4a, the convex surfaces 62 and the concave reflecting surfaces 63 are shown schematically as circles around the discrete electrodes 23. It will be appreciate that whilst in the forth and fifth devices the electrode arrangement is the same as in FIG. 1, this could equally well have been that of FIG. 2.

Figure 5:
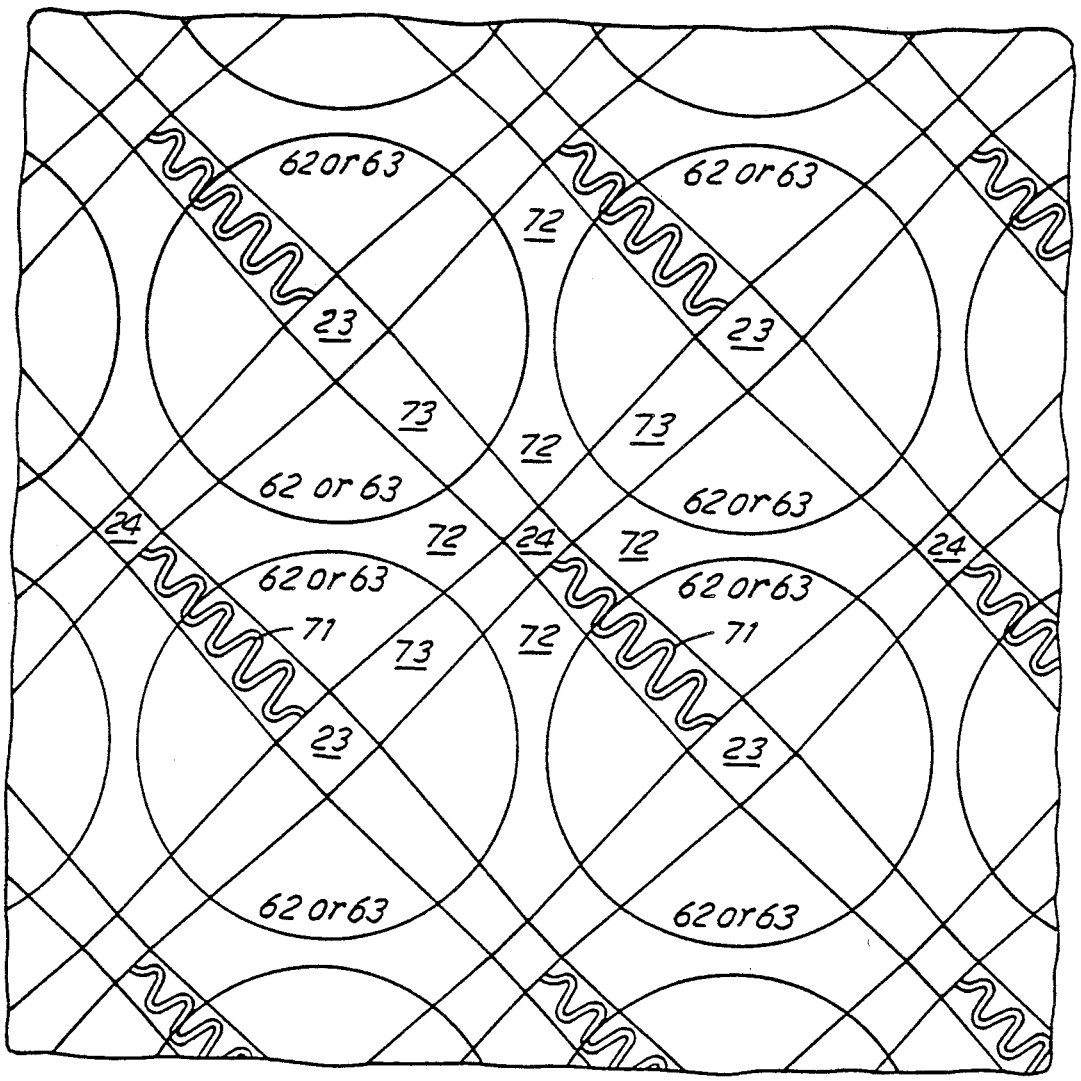
FIG. 5 is a schematic view of the part of the sixth device, illustrating the discrete electrode structure.

Referring now to FIG. 5 the sixth device to be described includes two further means for reducing the thermal losses from the pyroelectric detector elements. Firstly the thermal conductance from the electrodes 23 to the corresponding patch 24 and pillar 26 is reduced by replacing the straight narrow conductors in the arrangements of FIGS. 1 and 2 by meandering conductors 71. Secondly, thermal conductance through the pyroelectric film 21 is reduced by forming holes 72 in the pyroelectric film. Either of these arrangements could also be used with the electrode arrangements of FIG. 2. In FIG. 5, the electrodes 23 and patches 24 are smaller than in FIG. 1, facilitating the use of narrow strips of film 73 between the pairs of adjacent holes 72. In order to concentrate the received energy on the electrodes 23, a convex lens 62 transparent to infrared may be placed over each inter-connected electrode 22, as at 62 in FIG. 4b, or a concave mirror 63 may be placed under each discrete electrode 23, as at 63 in FIG. 4c. The lenses 62 or mirrors 63 are shown schematically as circles in FIG. 5.

Clearly, embodiments of the present invention are not restricted to the particular shapes of electrodes shown and described hereinbefore. Thus, the electrodes can be of a complex shape; in an advantageous form, the shape of the electrodes conforms to the isothermal-resistance contours of the device, such that the electrodes are located in regions wherein the thermal resistance to ground has a relatively high value (preferably being at its highest).

In embodiments wherein one electrode at least partially encloses another electrode, preferably the outer boundary of the inner electrode and the inner boundary of the outer electrode have a similar shape in accordance with the isothermal-resistance contours of the locality, and not necessarily similar to the shape of the outer boundary of the outer electrode which is in accordance with the isothermal-resistance contours of the respective locality.

I claim:

1. A thermal imaging device comprising a layer of pyroelectric material and having first and second major surfaces; an array of interconnected electrodes on the first major surface of the layer; an array of discrete electrodes on the second major surface of the layer, a plurality of electrically conductive regions on the second major surface of the layer, each discrete electrode being separated from, but not substantially surrounding, a respective one of the electrically conductive regions, a plurality of elongate strips of electrically conductive material for electrically connecting respective discrete electrodes and electrically conductive regions on the second major surface; and a plurality of pillars, each extending from a respective electrically conductive region, for supporting the layer and for providing an electrically conductive path between the discrete electrodes and an electrical signal processing means via respective elongate strips and electrically conductive regions.

2. A device according to claim 1 in which the layer is a thin film of pyroelectric material.

3. A device according to claim 1 in which the elongate strips have a length to width ratio of at least 5.

4. A device according to claim 1 in which the discrete electrodes are arranged in rows and columns and said electrically conductive regions are situated at the centres of respective rectangles formed by the centres of four adjacent discrete electrodes.

5. A device according to claim 1 in which the discrete electrodes are arranged in interleaved rows and interleaved columns and the electrically conductive regions are situated at the centres of respective triangles formed by the centres of three adjacent, discrete electrodes.

6. A device according to claim 1 in which respective supplementary electrodes are provided in regions of the second major surface between each discrete electrode and the adjacent pillars, each supplementary electrode being connected to a respective pillar, the pillar having two independent electrically conductive paths to the electrical signal processing means.

7. A device according to claim 1 including an optical arrangement effective to divert infrared radiation from a source and incident on nonelectroded regions of the layer onto the electrodes.

8. A device according to claim 7 in which the optical arrangement is a lens arrangement interposed between the source and the layer.

9. A device according to claim 7 in which the optical arrangement is a reflective arrangement interposed between the layer and the signal processing means.

* * * * *